United States Patent [19]
Itatani et al.

[11] Patent Number: 5,188,862
[45] Date of Patent: Feb. 23, 1993

[54] MICROWAVE PLASMA GENERATING APPARATUS AND PROCESS FOR THE PREPARATION OF DIAMOND THIN FILM UTILIZING SAME

[75] Inventors: Ryohei Itatani, Kyoto; Kazuyuki Fukumoto, Sodegaura, both of Japan

[73] Assignee: Idemitsu Petrochemical Company Limited, Tokyo, Japan

[21] Appl. No.: 587,130

[22] Filed: Sep. 24, 1990

[30] Foreign Application Priority Data

Sep. 26, 1989 [JP] Japan .................................. 1-249830

[51] Int. Cl.⁵ ........................ C23C 16/48; C23C 16/50
[52] U.S. Cl. .................................. 427/570; 427/249;
427/575; 427/577; 118/723; 423/466;
156/DIG. 68
[58] Field of Search ............... 118/723; 156/DIG. 68;
423/446; 427/39, 45.1, 249

[56] References Cited

U.S. PATENT DOCUMENTS

| | | | |
|---|---|---|---|
| 3,609,448 | 9/1971 | Williams | 315/111 |
| 4,909,184 | 3/1990 | Fujiyama | 118/723 |
| 4,989,542 | 2/1991 | Kamo | 118/723 |

FOREIGN PATENT DOCUMENTS

3736917A1 5/1988 Fed. Rep. of Germany.
2408972 6/1979 France.
63-241180 10/1988 Japan.

*Primary Examiner*—Richard Bueker
*Attorney, Agent, or Firm*—Nikaido, Marmelstein, Murray & Oram

[57] ABSTRACT

A microwave plasma generating apparatus for generating plasma by radiating microwave into a space in which electric discharge takes place contains a plurality of microwave radiating means for radiating a plurality of microwaves having different directions of electric fields from each other. This microwave plasma generating apparatus can produce a diamond thin film by exciting a carbon source gas supplied into the space and bringing the excited gas into contact with a substrate to be formed thereon with the diamond thin film, the substrate being disposed in the space in which the electric discharge is performed. This apparatus can produce a large volume of plasma in a stable fashion and, as a result, provide a diamond thin film in a large area as a whole.

9 Claims, 13 Drawing Sheets

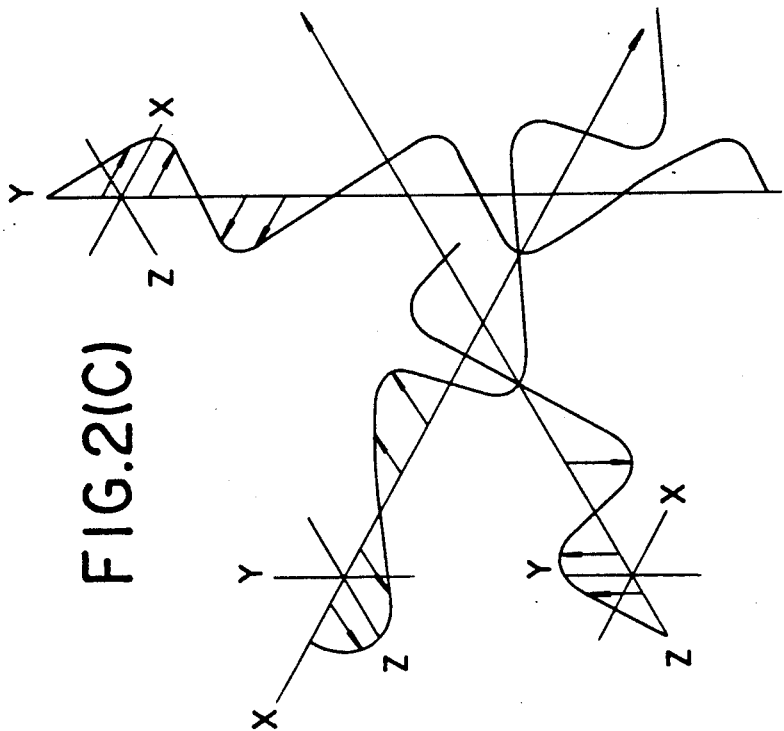
FIG.2(A)
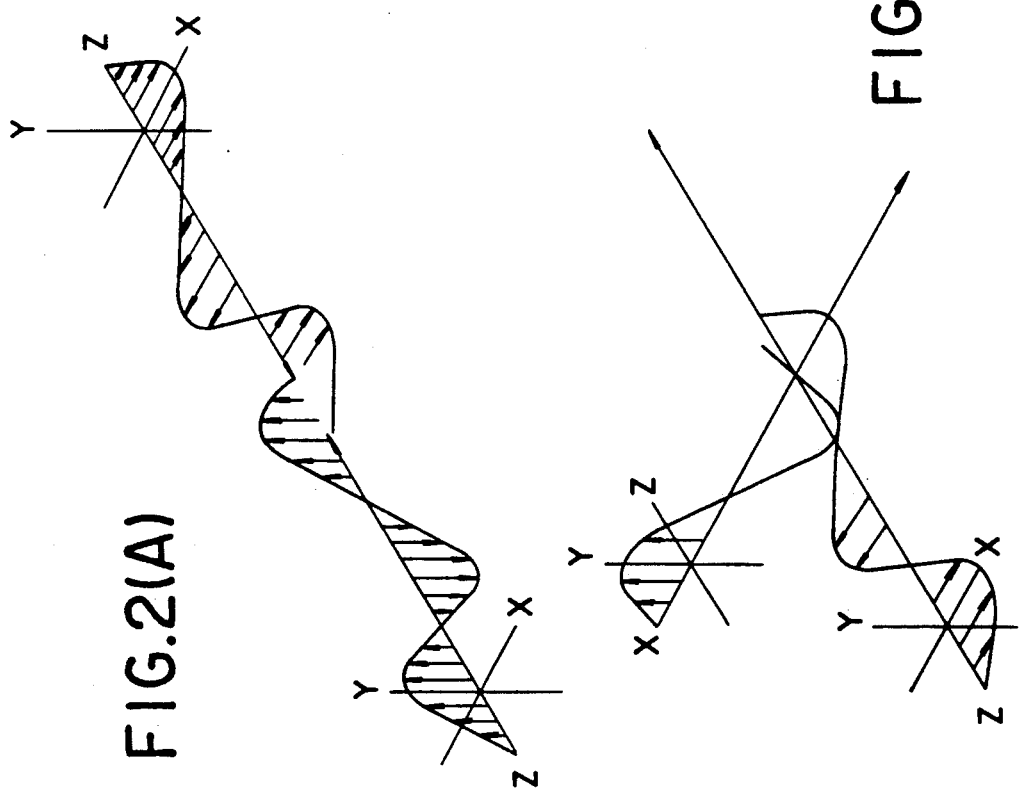
FIG.2(B)
FIG.2(C)

RADIATING
DIRECTION OF
MICROWAVE

FIG.9(A)
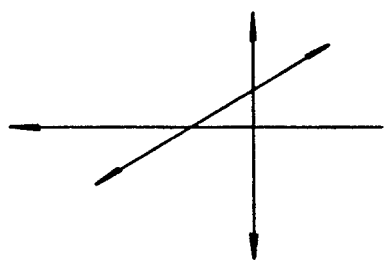
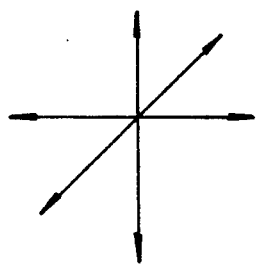
FIG.9(B)

MICROWAVE PLASMA GENERATING APPARATUS AND PROCESS FOR THE PREPARATION OF DIAMOND THIN FILM UTILIZING SAME

BACKGROUND OF THE INVENTION

1. Field of the Invention

The present invention relates to a microwave plasma generating apparatus and a process for the preparation of a diamond thin film utilizing the microwave plasma generating apparatus and, more particularly, to such a microwave plasma generating apparatus as capable of generating a large volume of microwave plasma in a stable fashion and to such a process for the preparation of a diamond thin film having a totally large area and a uniform quality by using the microwave plasma generating apparatus.

2. Description of Related Art

Microwave plasma generating apparatuses are of the type which are designed so as to generate plasma from a source gas by radiating microwaves in an electric discharge space filled with the source gas.

Conventional microwave plasma generating apparatuses of this type suffer from the disadvantage that plasma cannot be rendered of a large volume due to a limited electric power when a single electric power plant is employed.

In order to improve this disadvantage, a technique of introducing microwaves from multiple directions into a space in which electric discharge takes place has been developed, as disclosed in Japanese Patent Unexamined Publication (kokai) No. 24,094/1989, however, this technique has the drawback that plasma of a large volume cannot be generated in a stable fashion for a long period of time because the plasma generated may migrate due to interference of microwaves with each other and changes in a phase difference.

On account of this drawback, the use of such a microwave plasma generating apparatus for the process for preparing a diamond thin film cannot result in the formation of a diamond thin film having a uniform film thickness on a substrate of a large area.

FIG. 12 illustrates a conventional microwave plasma generating apparatus, comprising a quartz tube 13 within which a silicone wafer is set in a predetermined position, two pairs of a rectangular-sectioned waveguide 1 and a rectangular-sectioned waveguide 16 with a built-in reflector (short plunger) are concentrically disposed around and outside the outer periphery of the quartz tube 13 so as for each of the rectangular-sectioned waveguides 1 and 1 to face each of the corresponding rectangular-sectioned waveguides 16 and 16 with the built-in reflectors. In this illustration, each of the rectangular-sectioned waveguides is disposed so as for its rectangular opening in section to allow its two longer opposite sides to lie in a transverse direction, i.e., in a direction horizontal to the normal axis of the quartz tube 13, while allowing its two shorter opposite sides to lie in a longitudinal direction, i.e., in a direction parallel to the axis of the quartz tube 13. In other words, the direction of the electric field Ex1 and Ex2 of the microwave radiated between the pair of the rectangular-sectioned waveguides 1 and 16 is the same as the direction of the electric field Ey1 and Ey2 of the microwave radiated between the other pair of the rectangular-sectioned waveguides 1 and 16. The disposition of the electric fields in the same directions cannot stably generate a large volume of plasma for a long period of time.

SUMMARY OF THE INVENTION

Therefore, in order to solve the problems encountered with the related art known to the skilled in the art, the present invention has the object to provide such a microwave plasma generating apparatus as capable of stably generating a large area of plasma in a constant position for a long period of time.

The present invention has another object to provide a process for the preparation of a diamond thin film by using the microwave plasma generating apparatus.

In order to achieve the objects as described hereinabove, the present invention in an aspect consists of a microwave plasma generating apparatus capable of generating plasma by radiating microwaves into a space in which electric discharge takes place, which is provided with a radiation means for radiating a plurality of microwaves having different directions of electric fields into a space in which electric discharge takes place.

In another aspect, the present invention consists of a process for the preparation of a diamond thin film by utilizing the microwave plasma generating apparatus according to the first aspect of the present invention as generally described hereinabove, in which a carbon source gas is fed to a space in which electric discharge takes place, the source gas is excited to plasma, and the excited source gas is brought into contact with a substrate disposed in the electric discharge space.

Other objects, features and advantages of the present invention will become apparent in the course of the description of the preferred embodiments, which follows, in conjunction with the accompanying drawings.

BRIEF DESCRIPTION OF THE DRAWINGS

FIG. 9(A) and (B) each are diagrammatical representations of the direction of an electric field of microwave when the microwave is radiated by the microwave plasma generating apparatus of FIG. 8.

Figure 1A:
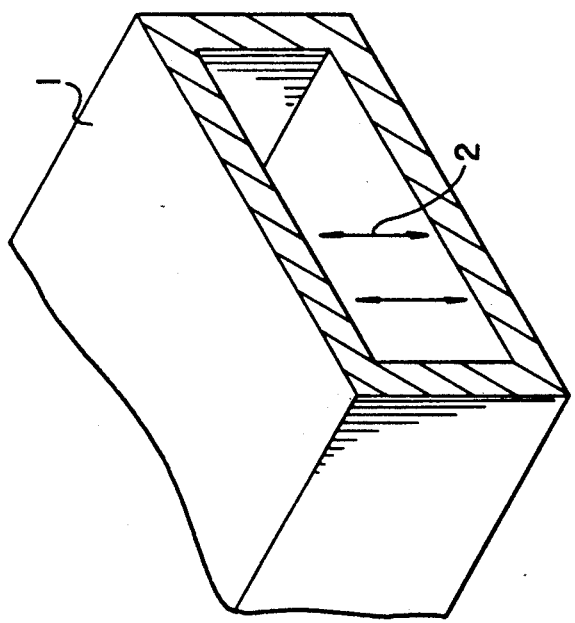
FIGS. 1(A), (B) and (C) each are cross-sectional perspective views showing a waveguide for regulating the direction of the electric field of a microwave.

Other objects, features and advantages of the present invention will become apparent in the course of the description of the preferred embodiments, which followed, in conjunction with the accompanying drawings.

DESCRIPTION OF THE PREFERRED EMBODIMENTS

A. Microwave Plasma Generating Apparatus

The microwave plasma generating apparatus according to the present invention comprises a microwave radiating means for concurrently radiating a plurality of microwaves having different directions of electric fields into a space in which electric discharge takes place, a gas discharging means for discharging gases from the electric discharge space, a source gas supply means for supplying a source gas to the electric discharge space, and a plasma generating chamber for generating plasma and defining the space in which electric discharge takes place.

The microwave plasma generating apparatus according to the present invention involves reducing the pressure in the electric discharge space defined by and in the plasma generating chamber to a predetermined level by the discharge means, supplying the source gas to the electric discharge space with the pressure reduced, and radiating the source gas fed into the reduced electric discharge space concurrently with the plural microwaves having different directions of electric fields from a plurality of the microwave radiating means, thereby causing no interference of the radiated microwaves with each other and consequently generating a large volume of plasma in a stable fashion.

It should also be noted that it is particularly prefered to radiate each of the microwaves from a plurality of the microwave radiating means in such a manner that their electric fields intersect each other at the substantially right angles, however, the microwaves may be radiated so as for the directions of their electic fields to intersect each other at an angle that is somewhat different from the right angle to such a small extent as causing no harmful interference.

The microwave radiating means generally comprises a microwave oscillator and a waveguide.

The microwave oscillator may be of any known construction such as, for example, Klystron, magnetron, or the like. Of those microwave oscillators, the use of the magnetron is preferred. Although the magnetron is available in various types, either a pulsed magnetron or a continuous wave magnetron can advantageously be employed for the microwave oscillator.

The pulsed magnetron is capable of generating the microwave having frequencies in the range from 300 MHz to 95 GHz at an output power of 1 kW to 5 MW. In contrast, the continuous wave magnetron is capable of generating the microwave having frequencies in the range from 800 MHz to 15 GHz at an output power of 1 kW to 100 KW.

The number of the microwave oscillator to be disposed in the microwave plasma generating apparatus according to the present invention may be one or may be equal to the number of the waveguide to be disposed therein.

When the microwave oscillator is disposed by one, on the one hand, a branching tube may be interposed between the one microwave oscillator and a plurality of waveguides, thereby allowing the branching tube to distribute the microwaves oscillated from the microwave oscillator into each of the waveguides. When the plural microwave oscillators are disposed in the number equal to the waveguides, on the other hand, each of the microwave oscillators is connected to an end of each of the waveguides.

The waveguides to be used for the present invention may include, for example, a generally square-sectioned waveguide, a generally rectangular-sectioned waveguide, a generally round-sectioned waveguide, a generally elliptically sectioned waveguide, and so on.

The plasma generating chamber of the microwave plasma generating apparatus according to the present invention contains the space in which electric discharge takes place, and is connected to the gas discharging means for discharging the gases from the electric discharge space and the source gas supply means for supplying the source gas to the electric discharge space are connected to the plasma generating chamber.

The plasma generating chamber may constitute a hollow resonator whose reaction chamber forming the space in which electric discharge takes place is lined with a metal as a whole. Further, a discharge tube may be disposed in the plasma generating chamber, thereby forming the space where electric discharge takes place.

As the gas discharging means may be employed any conventional means that can reduce the pressure within the space in which the electric discharge takes place.

The source gas supply means may be any one that can supply a source gas into the space where the electric discharge takes place.

As the plasma source gas, there may be employed any conventional source gas for generating plasma for use with conventional plasma generating apparatuses or a mixture thereof, and the plasma source gas may include, for example, air, nitrogen, oxygen, argon, hydrogen, methane, carbon monoxide, carbon dioxide, alcohols, silane, disilane, diborane, geruman, carbon compound containing fluorine or chlorine, phosphorus, sulfur compound, hydride or organometal compound.

These plasma source gas can generate plasma upon radiation with microwaves.

Description will now be made of the preferred embodiments of the structure of the microwave plasma generating apparatus according to the present invention.

Figure 7A:
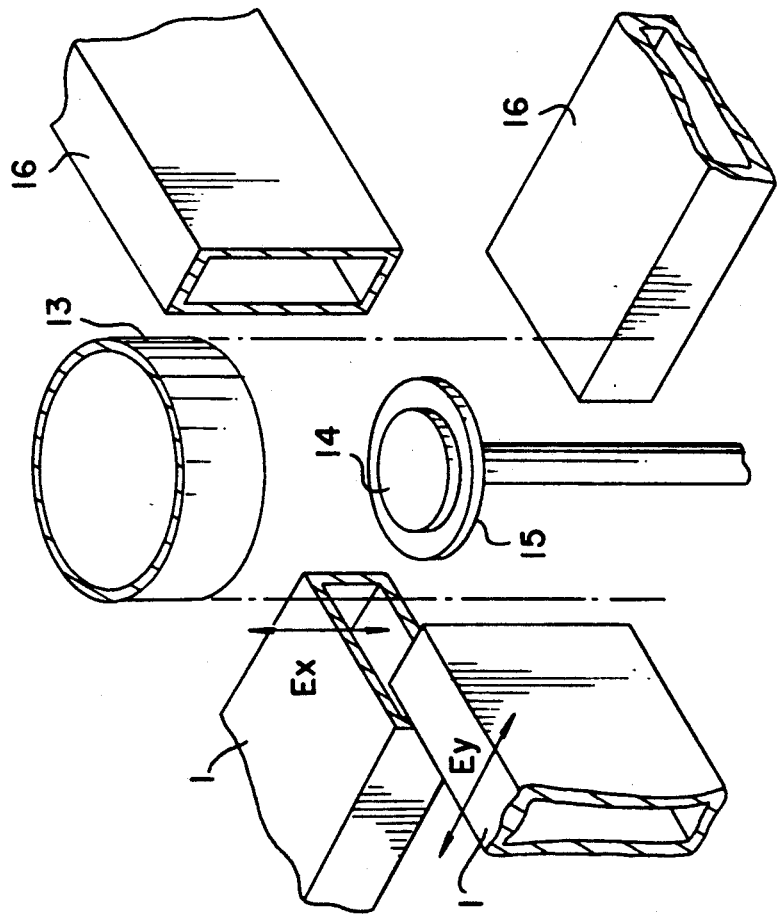
FIG. 7(A) is a perspective view, with a portion cut away, showing an embodiment of the microwave plasma generating apparatus according to the present invention.
Figure 7B:
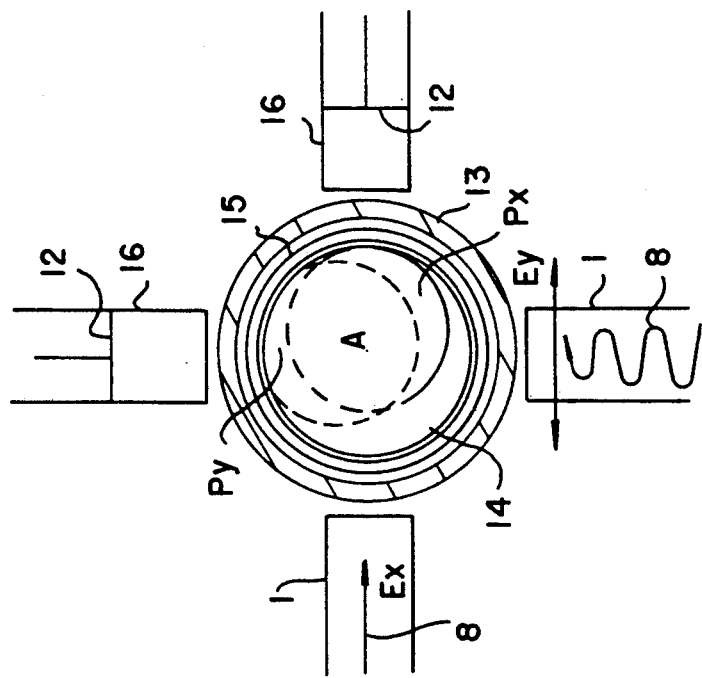
FIG. 7(B) is a partially sectional, top plan view showing schematically the location of plasma when the microwave plasma generating apparatus of FIG. 7(A) is employed.

Referring to FIGS. 7(A) and 7(B), the microwave plasma generating apparatus according to the present invention is shown, which has each of two waveguides 1 and 1 in a generally rectangular cross-section disposed around or outside the outer periphery of a cylindrical quartz tube 13 so as to be in pairs with each of two waveguides 16 and 16 being shaped in a generally rectangular-sectioned form and having a reflector built therein, thereby allowing the electric fields of the microwaves travelling between a pair of the two waveguides 1 and 16 and between another pair of the two waveguides 1 and 16 to intersect each other at the right angle on a disk-shaped substrate 14 placed on the top of a susceptor 15 disposed in the cylindrical quartz tube 13 so as to be rotatable by means of a driving source (not shown). As a plasma gas, a mixed gas of, for example, hydrogen and carbon monoxide is introduced into the quartz tube 13.

This arrangement allows the microwave oscillated from a microwave oscillator (not shown) to be radiated from a generally rectangular-sectioned opening of each of the waveguides 1 and 1 and to be directed to the disk-shaped substrate 14 on which the electric field Ex of the microwave intersects the electric field Ey of the microwave oscillated by the another microwave oscillator (not shown) and radiated from an opening of another waveguide 1 at the substantially right angle or in a direction perpendicular to the direction of the electric field Ey of another microwave. Further, the former microwave overlaps with the latter microwave having the electric field in a direction rectangular to a direction of the electric field of the former microwave on the disk-shaped substrate 14, thereby generating a large volume of plasma. This arrangement does not allow the microwaves to interfere with each other and to migrate, thereby enabling the generation of a large volume of plasma in a constant position for a long period of time.

Referring specifically to FIG. 7(B), plasma generated by the microwave 8 having the direction of the electric field Ex is indicated by the solid line as reference symbol Px, while plasma generated by the microwave 8 having the direction o the electric field Ey is indicated by the dot line as reference symbol Py. In this drawing, reference symbol A denotes schematically the constant location at which the plasma is positioned.

Figure 8:
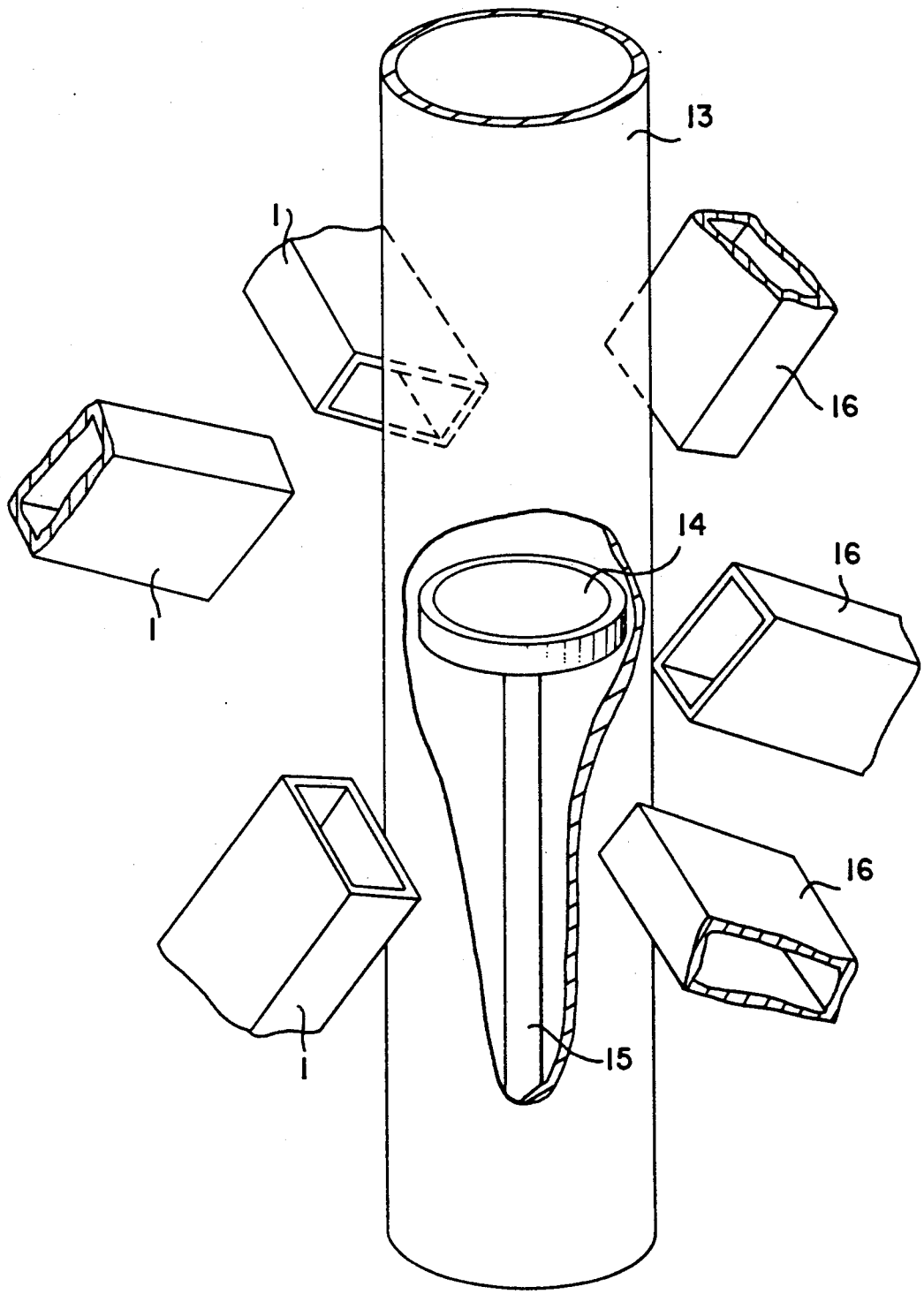
FIG. 8 is a perspective view, with a portion cut away, showing another embodiment of the microwave plasma generating apparatus according to the present invention.

FIG. 8 illustrates another preferred embodiment of the microwave plasma generating apparatus according to the present invention, in which microwaves are radiated from three directions.

As shown in FIG. 8, three pairs of the rectangular waveguides 1, 1 and 1 and the generally rectangular-sectioned waveguides 16, 16 and 16 with reflectors are concentrically disposed around or outside the periphery of the quartz tube 13 so as to intersect each other in x-axial, y-axial and z-axial directions on the substrate 14 placed rotatably on a top of the susceptor 15 disposed within the quartz tube 13. This arrangement also permits the directions of the electric fields of the microwaves 8 to cross each other at the right angle. Said susceptor can be rotated by unshowing driving means.

In this case, the directions of the electric fields of the microwaves may intersect each other at right angle at a point at which one of the three directions departs from the point where the rest of the three direction, i.e., two directions, overlaps with each other, as shown in FIG. 9(A), or at a substantially one point at which all of the three directions overlap concurrently with each other, as shown in FIG. 9(B).

. This construction can also stably generate the plasma in a large volume at the constant location for a long period of time.

Figure 10:
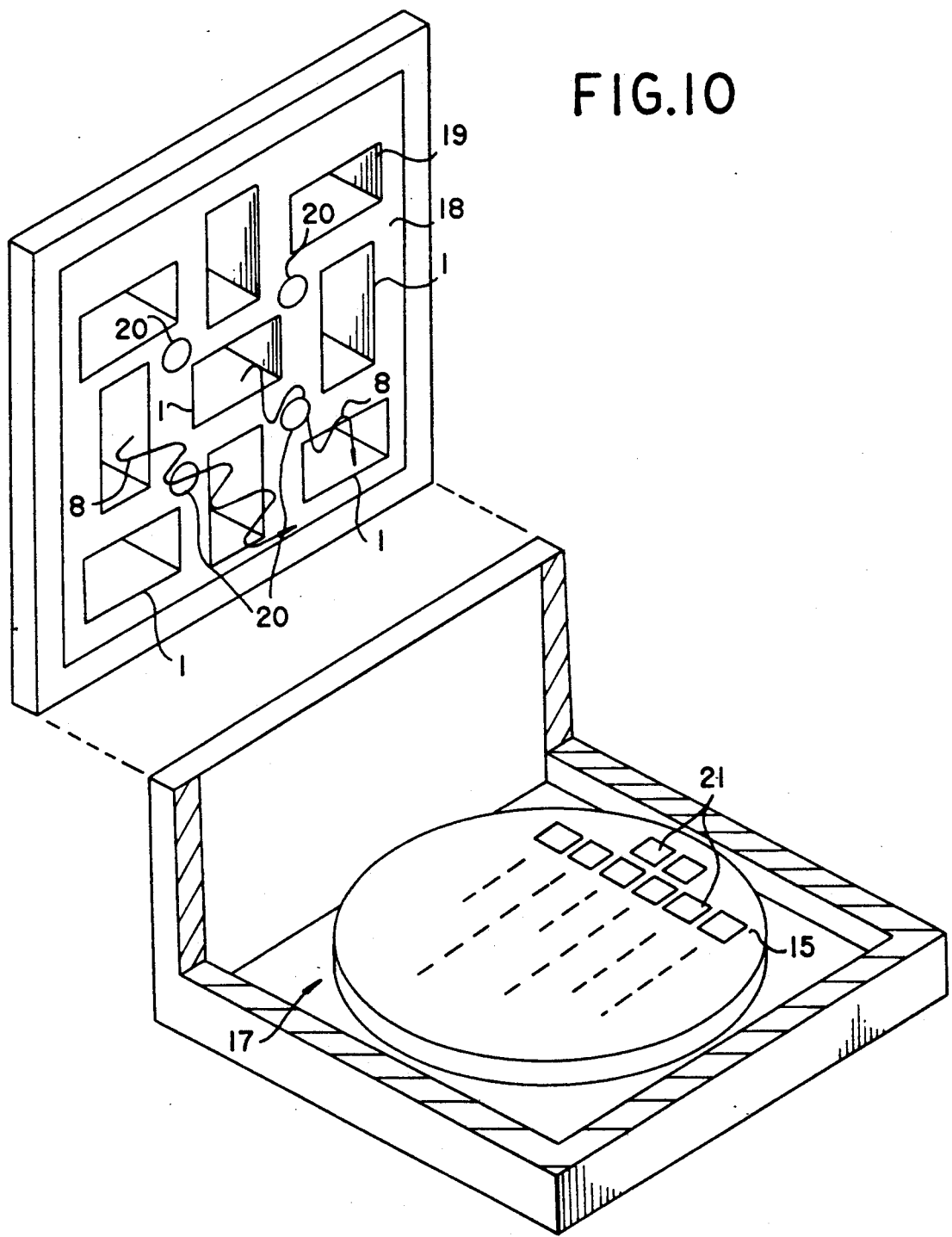
FIG. 10 is a perspective view, with a portion cut away, showing a plasma generating chamber of the microwave plasma generating apparatus which can produce diamond thin film according to the present invention.

FIG. 10 illustrates a further embodiment of the plasma generating chamber of the microwave plasma generating apparatus according to the present invention. As shown in FIG. 10, a wall portion 18 of the plasma generating chamber 17 has a plurality of rectangular-sectioned waveguides 1 disposed so as to allow their generally rectangular-sectioned openings 19 of the corresponding rectangular-sectioned waveguides 1 to be arranged so as to lie in a longitudinal direction and in a transverse direction in an alternate order or position. In other words, the direction of the electric field of the microwave to be radiated from the generally rectangular-sectioned opening of the waveguide 1 is approximately perpendicular to the direction of the electric field of the microwave to be radiated from the generally rectangular-sectioned opening of the adjacent waveguide 1. A feed opening 20 for feeding a plasma source gas is disposed between the generally rectangular-sectioned opening 19 of the waveguide 1 and the generally rectangular-sectioned opening 19 of the adjacent waveguide 1. On a bottom of the plasma generating chamber 17 is mounted a rotatable susceptor 15 on which a plurality of substrate chips 21 are placed. In this embodiment, it is to be noted that the height between the inner bottom surface and the inner top surface of the plasma generating chamber 17 is set to a half of the wavelength of the microwave 8.

As shown in FIG. 10, as the generally rectangular-sectioned opening 19 of the waveguide 1 is disposed so as for its two longer parallel sides to lie in a transverse direction while the generally rectangular-sectioned opening 19 of the adjacent waveguide 1 is disposed so as for its two longer parallel sides to stand upright or to lie in a longitudinal direction, the microwaves 8 having the electric field in the longitudinal direction radiated from the generally rectangular-sectioned opening 19 of the waveguide 1 are to cross the microwaves 8 having the electric field in the transverse direction radiated from the generally rectangular-sectioned opening 19 of the adjacent generally rectangular-sectioned waveguide 1 at the right angle. Thus, when the source gas is supplied from the feed opening into the plasma generating chamber 17 and the microwaves are radiated to the plasma source gas in the manner as described hereinabove, the plasma source gas excites to generate plasma. In this case, it is noted that the directions of radiating the microwaves 8 are parallel to each other yet the electric field of the microwave radiated from each of the generally rectangular-sectioned openings 19 of the waveguides 1 is perpendicular to each other, thereby generating a large volume of plasma. Further, as described hereinabove, as the space in the plasma generating chamber defined between its inner bottom surface and inner top surface is set to a half wavelength of the microwave, a standing wave is formed within the scope stabilizing the generation of plasma.

The susceptor 15 may preferably be composed of a material which is unlikely to absorb or reflect the microwaves, such as quartz or alumina, in order to prevent or reduce absorption or reflection of the microwaves.

As described hereinabove, it may be effective that the height or distance between the inner bottom surface and the inner top surface of the plasma generating chamber 17 is set to a length corresponding to one wavelength of the microwave 8, whereas the distance between a top surface of the susceptor 15 and the ceiling surface of the plasma generating chamber 17 is set to a half wavelength of the microwave. It is to be noted, however, that the use of a generally rectangular-sectioned waveguide with a plasma spaced fin 7, as will be described more in detail hereinafter, may not require the setting of the distance between the bottom surface and the ceiling surface in the plasma generating chamber to a half wavelength of the microwave used and may set the distance between them to an arbitrary distance.

It can be noted herein as preferred that, when the the microwaves are radiated in the directions parallel to each other yet their electric fields are intersecting each other at the substantially right angles, as described hereinabove, the microwave is first radiated as a seed microwave from the rectangular waveguide 1 disposed in the center position of a group of the generally rectangular-sectioned waveguides 1 on the wall portion of the plasma generating chamber and thereafter the microwaves are to be radiated from the rest of the generally rectangular-sectioned waveguides 1 as shown in FIG. 10.

Figure 11:
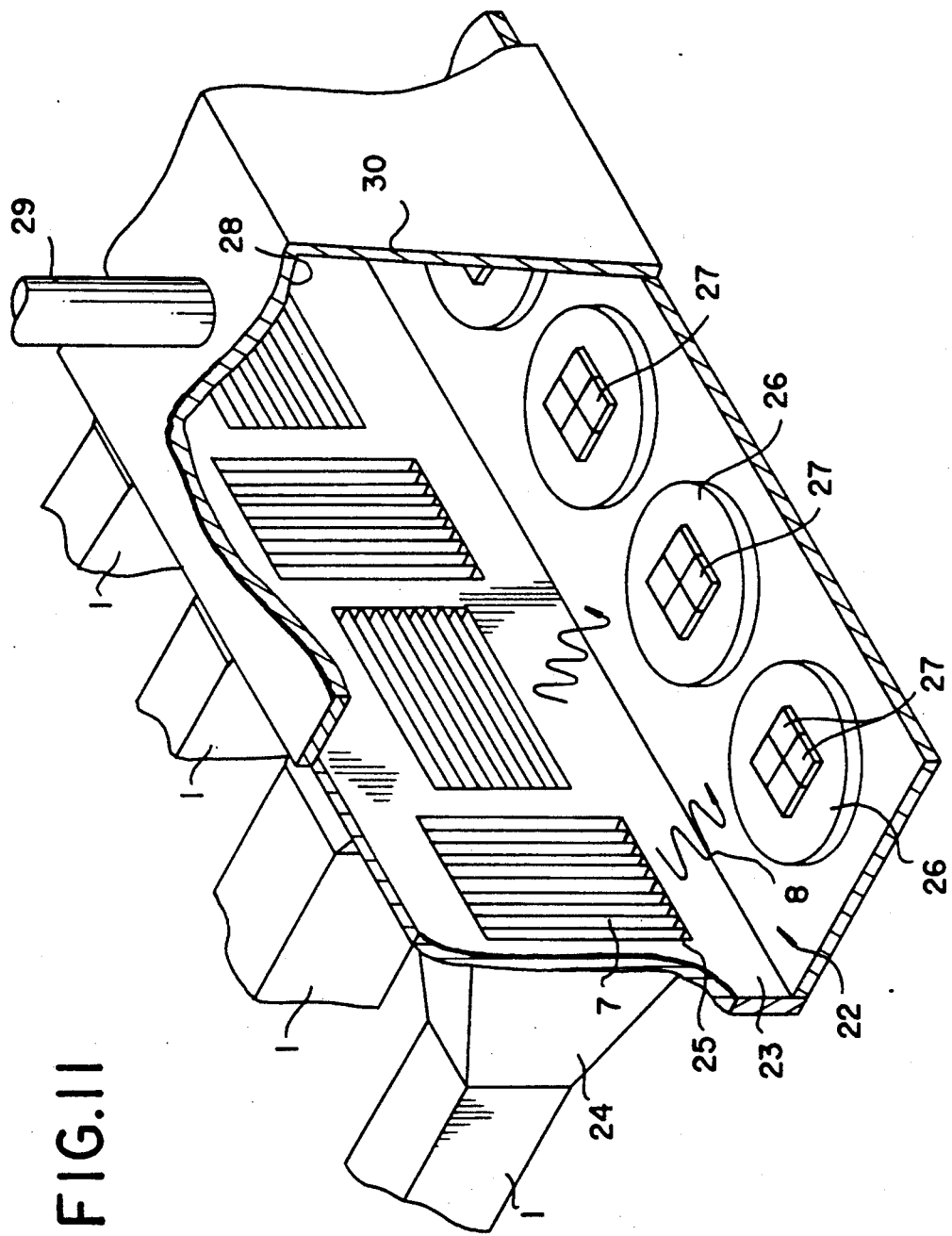
FIG. 11 is a perspective view, with a portion cut away, showing another embodiment of a plasma generating chamber of the microwave plasma generating which can produce diamond thin film apparatus according to the present invention.

FIG. 11 illustrates an embodiment of the microwave plasma generating apparatus in which a plurality of antenna horns 24 with the plasma spaced fin or fins 7 disposed therein are mounted so as to have their openings 25 in a generally rectangular cross-section on a one side surface 23 of the plasma generating chamber 22. Each of the antenna horns 24 is disposed in a row so as for its plasma spaced fin or fins 7 to lie in an alternate direction with respect to the plasma spaced fin or fins 7 of the antenna horn 24 disposed adjacent. In other words, the antenna horns 24 are disposed such that the plasma spaced fin or fins 7 of one of the antenna horns 24 is disposed so as to lie in a transverse direction and the plasma spaced fin or fins 7 of the adjacent antenna horn 24 is disposed so as to lie in a longitudinal direction. Each of the antenna horns 24 is connected at its other end to the generally rectangular-sectioned waveguide 1. On a floor portion of the plasma generating chamber 22, a plurality of rotatable, disk-shaped susceptor 26 are mounted in a row in such a fashion that each of the susceptor 26 is located in front of each of the corresponding rectangular-sectioned openings 25 of the antenna horns 24. On each of the susceptors 26 are placed a plurality of substrate chips 27. The source gas is supplied to the plasma generating chamber through a source gas supply piping 29 disposed on the ceiling 28 of the plasma generating chamber 22 in the position corresponding to each of the susceptor 26 with the plural substrate chips 27 placed thereon.

The microwave plasma generating apparatus of the construction as illustrated in FIG. 11 permits the microwaves 8 to be radiated from the generally rectangular-sectioned opening 25 of the antenna horn 24, the microwaves 8 having the electric field in the direction longitudinal to the two longer parallel sides of antenna horn 24. As the generally rectangular-sectioned openings 25 of antenna horns 24 are disposed so as for their plasma spaced fins 7 to be arranged in a row along the floor portion of the plasma generating chamber in alternate ways, the electric field of the microwave radiated from one of the rectangular opening 25 of the antenna horn 24 is disposed so as to be substantially perpendicular to the electric field of the microwave radiated from the adjacent generally rectangular-sectioned opening 25 of the other antenna horn 24. As the microwaves 8 are radiated onto the source gas supplied from the source gas supply piping 29 into the plasma generating chamber 22, the source gas is so excited to generate plasma. At this moment, the microwaves 8 are radiated in the directions parallel to each other and their electric fields intersect each other at the substantially right angles in the manner as described hereinabove, thereby permitting the generation of a large volume of plasma. Further, it is to be noted that the plasma can be generated in a stable manner because the plasma spaced fin or fins 7 is or are mounted within the rectangular openings 25.

In instances where no plasma spaced fin 7 is mounted in the microwave plasma generating apparatus as shown in FIG. 11, it is preferred that the distance from the one wall surface 23 of the plasma generating chamber 22 to the opposite wall surface 30 thereof is set to a half wavelength of the microwave. It can be noted, however, that the distance between the wall surface 23 and the wall surface 30 is set to a length longer than the half wavelength of the microwave 8 if the waveguide 16 is provided with a reflecting structure corresponding to the built-in reflector thereof.

It is further to be noted that the microwave plasma generating apparatus according to the present invention is applicable to the electric discharge space of an open system as well as of a closed system.

The following technique may be employed for regulating the electric field of the microwave in the microwave radiating means so as to travel in a direction substantially perpendicular to each other or so as to cross each other at the right angle.

As shown in FIG. 1(A), the generally rectangular-sectioned waveguide 1 is used to arrange for the microwave travelling in a longitudinal direction through the generally rectangular-sectioned waveguide 1 so as for the direction of its electric field 2 to line in a direction parallel to the two shorter opposite sides of a generally rectangular-sectioned opening of the waveguide 1. In order to have their directions of the electric fields 2 of the microwaves intersect each other at the substantially right angle, the generally rectangular-sectioned waveguide 1 is disposed so as for its opening to lie in a transverse direction, i.e., for the two longer opposite sides of its opening to lie transversely, while the adjacent waveguide 1 is disposed to allow its generally rectangular-sectioned opening to lie in a vertical direction, i.e., for the two longer opposite sides thereof to lie vertically.

Figure 1B:
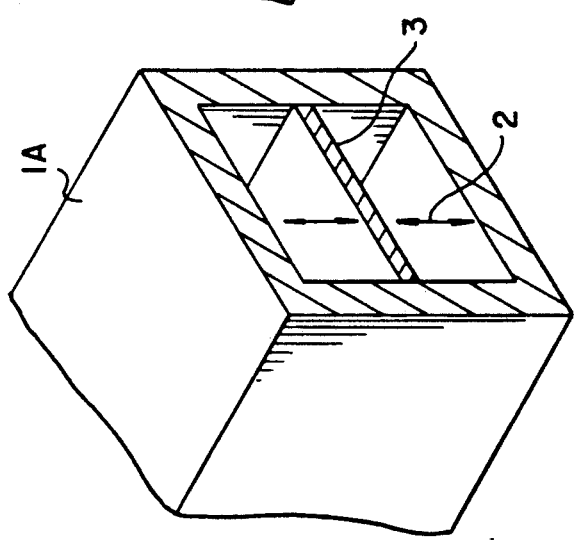

As shown in FIG. 1(B), a generally square-sectioned waveguide 1A is used whose generally square-sectioned opening is divided into two sections each having a rectangular cross section by a fin 3 functioning as determining the direction of the electric field of the microwave traveling through the generally square-sectioned waveguide 1A in its longitudinal direction. As a result, the direction of the electric field 2 of the microwave traveling through the sections of the generally square-sectioned waveguide 1A is regulated in a direction along the two shorter opposite sides of the rectangular cross section of the two divided sections. Hence, by combining a plurality of the generally square-sectioned waveguide 1A with their cross sections divided into two sections in substantially the same manner as the generally rectangular-sectioned waveguides 1 are arranged as in FIG. 1(A), the microwaves having different directions of their electric fields can be radiated into the space in which electric discharge takes place.

Figure 1C:
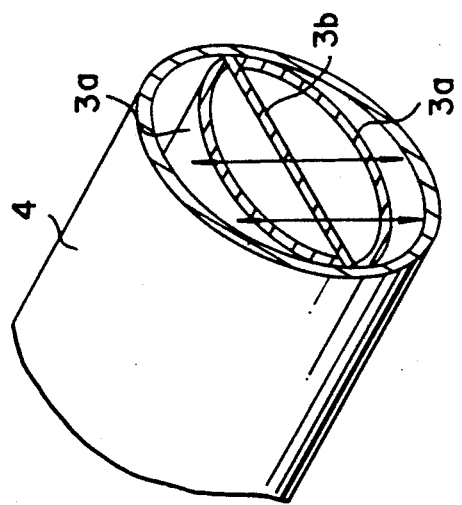

Further, as shown in FIG. 1(C), a generally round-sectional waveguide 4 is used which is provided with a fin 3b in a generally flat shape, functioning as determining the direction of the electric field of the microwave in a position extending generally straight in the radial direction of the generally round-sectional waveguide 4 and with two fins 3a each extending in a curved shape within each one of the two sections obtained by the division of the generally round-sectional opening of the waveguide 4 by the fin 3b.

In the embodiments of the waveguides as illustrated in FIGS. 1(A) to 1(C), the number of the fins 3 functioning as determining the direction of the electric field of the microwave to be radiated from the waveguide may be two or more. It is to be noted, however, that the fin 3 for determining the direction of the electric field thereof may also serve as a plasma spaced fin as will be described hereinafter if the number of the former becomes too large.

FIGS. 2(A) to 2(C) illustrate the directions of the microwaves travelling towards the space in which the electric discharge takes place.

FIG. 2(A) illustrates the case in which two microwaves are travelling in such a fashion that the two microwaves travel in directions opposite to each other yet the direction of the electric field of one of the two microwaves lies perpendicular to the direction of the electric field of the other microwave.

FIG. 2(B) illustrates the case in which two microwaves are crossing at an intersection point at a substantially right angle or at any angle and further the directions of the electric fields of the two microwaves lie substantially perpendicular to each other.

It is further to be noted that the number of the microwaves to be radiated is not restricted to two as illustrated in FIGS. 2(A) and 2(B) it may be three or more.

FIG. 2(C) illustrates the case where three microwaves which electric fields are perpendicular to each other are travelling in different directions in such a manner that two of the three microwaves are travelling in substantially the same manner as in FIG. 2(B) yet the rest of the microwave is travelling so as to cross the other one microwave at the intersection point or at any other point.

Figure 2D:
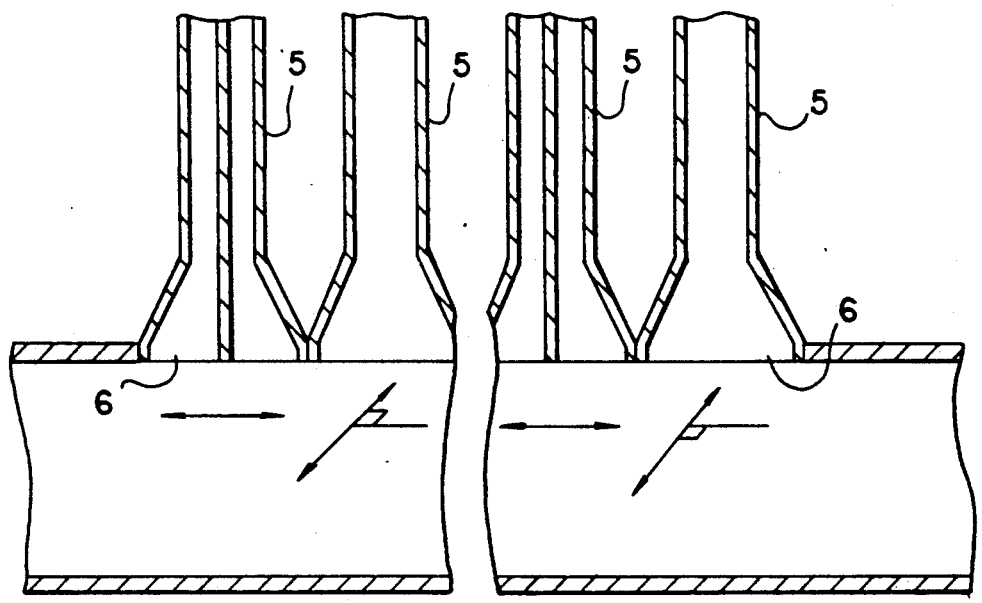
FIG. 2(D) is a longitudinal sectional view, showing the disposition of the waveguides.
Figure 2E:
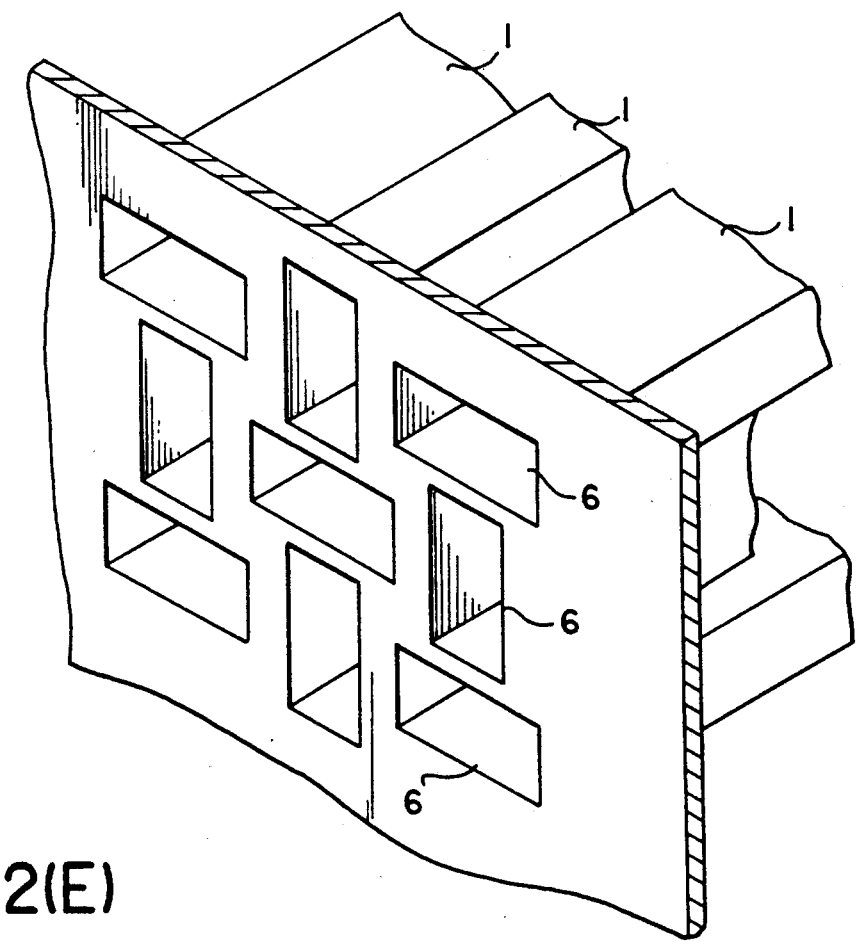
FIG. 2(E) is a partially sectional, perspective view, showing the disposition of the openings of the waveguides.

FIGS. 2(D) and 2(E) illustrate the disposition of the waveguides. FIG. 2(D) shows the case where the waveguides 5 are arranged so as for their openings 6 to be disposed in a row in a transverse direction. In this case, the microwaves are radiated in directions parallel to each other yet their electric fields are directed so as to intersect each other in alternate directions of right angles, as indicated by the arrows in the drawing. This arrangement can produce a large volume of plasma extending in a transverse direction. FIG. 2(E) illustrates the disposition of the waveguides 1 in plural rows in such a manner that their rectangular-section openings 6 in long shapes are arranged so as to lie in alternately transverse and longitudinal directions, thereby radiating the microwaves in the directions parallel to each other with their electric fields intersecting each other at substantially right angles. This construction of the waveguides 1 permits the production of plasma of a larger volume than the case as shown in FIG. 2(D).

Figure 2F:
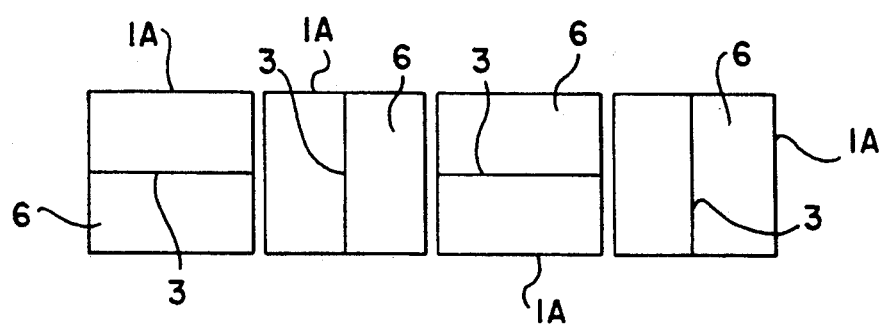
FIGS. 2(F) and (G) are schematically diagrammatical representation of the disposition of the square-sectioned waveguides and round-sectioned waveguides, respectively, having fins for determining the direction of the electric field of microwave.
Figure 2G:
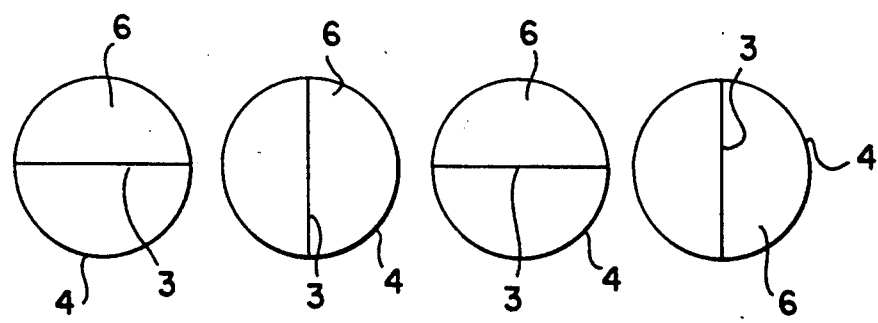
FIGS. 2(A), (B), and (C) each diagrammatic representation of directions of radiation of microwaves.

FIGS. 2(F) and 2(G) illustrate the arrangement for the fin 3 for determining the direction of the electric field of the microwave, which is disposed within the square waveguide 1A and the round-shaped waveguide 4, respectively, as well as the disposition of the waveguides in a row in a transverse direction. FIG. 2(F) shows the waveguides 1A with the fin 3 disposed so as to divide each of their sectional openings 6 into two sections and the disposition of the square waveguides 1A in a row in a transverse direction. It is also to be noted that these square waveguides 1A may be disposed in substantially the same manner as in FIG. 2(E). In this case, however, the square waveguides 1A are disposed so that their fins 3 extend in alternately transverse and longitudinal directions, thereby allowing the microwaves to travel in the directions lying parallel to each other yet their electric fields to travel in the directions lying substantially perpendicular to each other.

FIG. 2(G) illustrates the arrangement for the fin 3 for determining the direction of the electric field of the microwave in the generally round-sectioned waveguide 4 which in turn are disposed in a row in a transverse direction. The directions of the fins 3 mounted within each of the generally round-sectional waveguide 4 may extend in alternately transverse and longitudinal directions in the same manner as in the case of FIG. 2(F).

As described hereinabove, the number of the fins 3 to be mounted in each of the waveguide may be two or more. It is to be noted herein that, when the number of the fins 3 for determining the direction of the electric field of the microwave becomes larger enough, they can also function as plasma spaced fins.

As there is the possibility that the fin for determining the direction of the electric field of the microwave comes into contact with plasma at its end portion and that the plasma lights up between the fins for determining the direction of the electric field thereof, the fins for determining the direction of the electric field thereof may preferably be composed of a heat resistant material that can withstand temperatures as high as, for example, 600° C. or higher. Further, in order to reduce a loss of the energy of the microwave due to generation of electric charges in the fins during the guide of the microwaves, it is preferred that the fins for determining the direction of the electric field of the microwave are composed of an electrically conductive material. Such a material may include, for example, a metal such as molybdenum, beryllium, copper, silver or aluminium, an alloy such as stainless steel, or ceramics such as aluminium oxide ($Al_2O_3$), boron nitride (BN) or zirconia ($ZrO_2$) electroplated with a highly electrically conductive material such as silver or copper. The fin for determining the direction of the electric field of the microwave on its side in contact with the plasma may partially be joined with a fin composed of graphite.

Brief description will now be described of the plasma spaced fin.

Figures 3, 4:
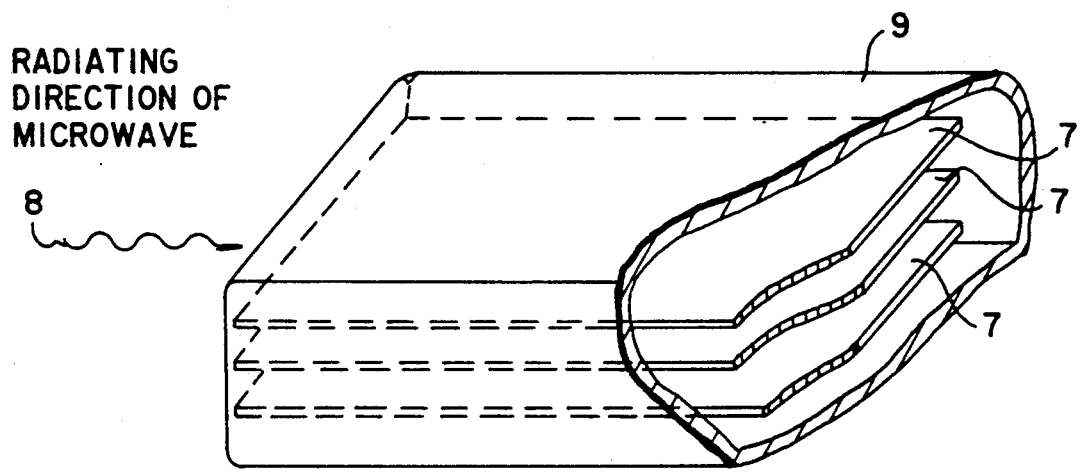
FIG. 3 is a partially sectional, perspective view showing one example of an antenna horn with a plurality of plasma spaced fins.
FIG. 4 is a diagrammatical representation of the relationship of the disposition of a plurality of the plasma spaced fins.

As shown in FIG. 3, each of the plasma spaced fins 7 has a shape of a generally flat plate and is so disposed and oriented as to have its respective surface lying perpendicular to the direction of the electric field of the microwave 8 and so to divide the sectional area taken along the direction of travel of the microwave 8.

Further, as shown in FIG. 3, the plural fins 7 are so disposed in a housing 9 as to guide the microwave 8 from one end of the housing 9 to the other end thereof.

Referring to FIG. 4, the distance d between the plasma spaced fin 7 and the adjacent plasma spaced fin 7 is determined by the pressure of the gas used and by the electric power transmitting the microwave. In other words, the distance d is to be determined so as to satisfy the following formula:

$$d < C/PE$$

where
C is a constant to be determined by the source gas;
P is the pressure; and
E is the intensity of the electric field of the microwave within the plasma.

Under usual circumstances where the plasma spaced fins are to be applied, it is preferred that the distance d between the two opposite plasma spaced fins is 2 cm or smaller. If the distance d becomes too wide, the number N of the plasma spaced fins 7 can be restricted to a small number which divide the sectional area of the housing perpendicular to the direction of travel of the microwave, thereby developing a tendency that the plasma becomes likely to be retained between the plasma spaced fins 7. The length l of each of the plasma spaced fins 7 taken along the direction of travel of the plasma, on the other hand, is not restricted to a specified one as long as the plasma spaced fin has a length that does not cause a standing wave of the microwave between the plasma spaced fin 7 and the adjacent plasma spaced fin 7, and the length l of the plasma spaced fin 7 may appropriately be determined, for example, in accordance with a wavelength of the microwave or in accordance with a scale of the plasma generated.

The plasma spaced fin 7 may be composed of a material that is the same as that of the fin 3 for determining the direction of the electric field of the microwave as described hereinabove.

Further, the way of disposing the plasma spaced fins 7 is not restricted to a specified one as long as they are generally to be disposed in a direction which lies substantially perpendicular to the direction of the electric field of the travelling microwave and which lies parallel to the direction of travel of the travelling microwave. And the plasma spaced fins 7 may be disposed within the waveguide or within the space in which the electric discharge takes place. The plasma spaced fin 7 may further be disposed within an antenna horn which is so arranged as to allow the opening at its one end to be connected to a top end portion of the waveguide and the opening at its other end to be connected to the space in which the electric field takes place.

In instances where the antenna horn is employed, as compared with the microwave plasma generating apparatus wherein the round-sectioned waveguide 4 or the rectangular-sectioned waveguide 1 is merely communicated with the space in which the electric discharge takes place, the advantage is presented that the spatial distribution of the intensity of the radiating electromagnetic waves can not only be adjusted, but the impedance matching can also be improved.

Figure 5:
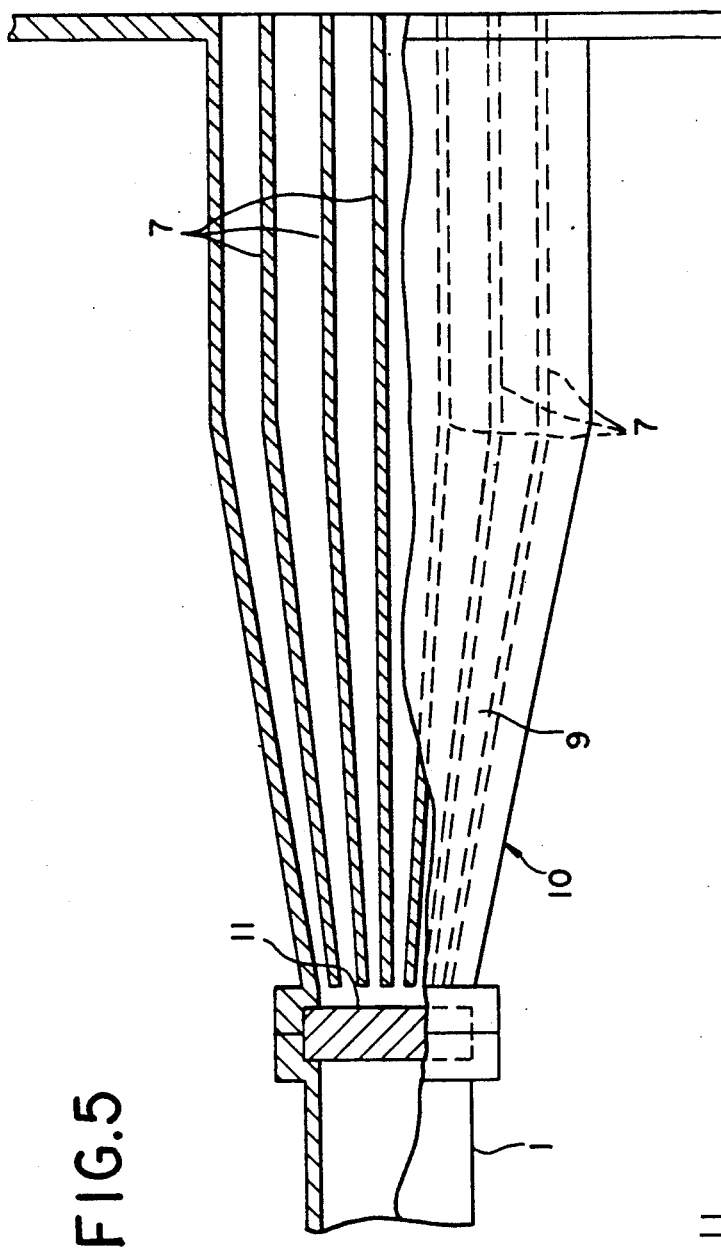
FIG. 5 is a longitudinal sectional view, with a portion cut away, showing the relationship of the disposition of a plurality of plasma spaced fins in one example of an antenna horn.

The antenna horn 10 as shown in FIG. 5 comprises a housing 9 having small-diameter and large-diameter openings defined respectively at opposite rear and front ends thereof, which is so shaped as to expand in a trapezoidal form from the small-diameter opening and as to have a shape of a rectangular cross section at its intermediate portion and extend the rectangularly sectioned shape up to the large-diameter opening, a small-diameter opening being coupled with the microwave outlet of the waveguide 1 through a microwave transmission windowpane 11 that is made of quartz, and the plural plasma spaced fins 7 disposed so as to extend within the rectangular-sectioned portion in a direction perpendicular to the direction of the electric field of the microwave 8. In this case, the end portion of the plasma spaced fin 7 on the side of the microwave transmission windowpane 11 is not always brought into contact with the microwave transmission windowpane 11 and it may be disposed in a certain distance.

Alternatively, the antenna horn which may be employed in the practice of the present invention may comprise a generally round-sectioned housing having small-diameter and large-diameter openings defined respectively at opposite rear and front ends thereof and also having a rear end portion thereof flared outwardly from the small-diameter opening towards a substantially intermediate portion thereof to represent a substantially conical shape while the opposite front end portion is so shaped as to extend straight therefrom towards the large-diameter opening thereby representing a generally cylindrical shape, and the plural plasma baffle fins 7 disposed within the generally cylindrical front end portion of the round-sectioned housing so as to lie perpendicular to the direction of the electric field of the microwave.

Figure 6:
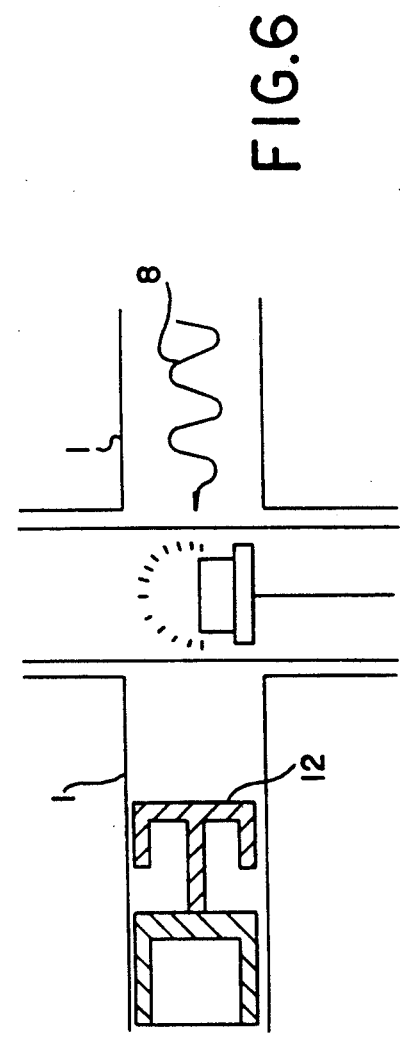
FIG. 6 is a diagrammatical representation of a microwave plasma generating apparatus, in which a reflector is disposed so as to generate standing wave by reflecting the microwaves into a waveguide.

Although the plasma generated by the microwave 8 can be positioned at a constant location by using the plasma spaced fins 7, the plasma may be located in a constant position by using a short plunger in conventional manner, thereby generating a standing wave, or by using a reflector 12 disposed in a position forwards in the direction of radiation of the microwave 8 so as to travel to and fro in the direction parallel to the direction of radiation of the microwave 8 by reflection of the microwave 8 on the reflector 12, as shown in FIG. 6.

In accordance with the present invention, it is preferred that two kinds of microwaves having the direction of the electric field of the microwave perpendicular to each other have substantially the same energy density.

B. Preparation of Diamond Thin Film

The microwave plasma generating apparatus according to the present invention may be applied to various uses and, particularly, to the preparation of a diamond thin film.

The diamond (polycrystalline) thin film may be prepared using the microwave plasma generating apparatus according to the present invention.

The preparation of the diamond thin film using the microwave plasma generating apparatus in one aspect of the present invention may involve supplying the carbon source gas within the space in which the electric discharge takes place, radiating the microwaves having the directions of the electric field perpendicular to each other from a plurality of the microwave radiating means to the carbon source gas so as to excite the carbon source gas and generate plasma, and bringing the plasma generated into contact with a surface of the substrate, thereby producing a diamond thin film thereon.

As the carbon source gases, there may be used, for example, gases resulting from a hydrocarbon compound, a halogen-containing compound, an oxygen-containing compound, a nitrogen-containing compound, or obtained by gasification of a carbon such as graphite.

The hydrocarbon compounds may include, for example, a paraffin-series hydrocarbon such as methane, ethane, propane, butane, or the like; an olefin-series hydrocarbon such as ethylene, propylene, butylene or the like; an acetylene-series hydrocarbon such as acetylene, allylene or the like, a diolefin-series hydrocarbon such as butadiene or the like; an alicyclic hydrocarbon such as cyclopropane, cyclobutane, cyclopentane, cyclohexane or the like; or an aromatic hydrocarbon such as cyclobutadine, benzene, toluene, xylene, naphthalene or the like.

The halogen-containing compounds may include, for example, a halogenated hydrocarbon such as a halogenated methane, a halogenated ethane, a halogenated benzene, carbon tetrachloride or the like.

The oxygen-containing compounds may include, for example, a ketone such as acetone, diethyl ketone, pinacholine, a cyclic ketone, an aromatic ketone, e.g., acetophenone or benzophenone, or the like; an alcohol such as methanol, ethanol, propanol, butanol or the like; an ether such as methyl ether, ethyl ether, methyl ethyl ether, methyl propyl ether, ethyl propyl ether, phenol ether, acetal, a cyclic ether, e.g., dioxane or ethylene oxide; an aldehyde such as formaldehyde, acetoaldehyde, butyl aldehyde, benzaldehyde or the like; an organic acid such as formic acid, acetic acid, priopionic acid, succinic acid, butyric acid, oxalic acid, tartaric acid, stearic acid or the like; an acid ester such as methyl acetate, ethyl acetate or the like; a divalent alcohol such as ethylene glycol, diethylene glycol or the like; or carbon oxide such as carbon monoxide or carbon dioxide.

As the nitrogen-containing compounds, there may be enumerated, for example, an amine such as trimethyl amine, triethyl amine, or the like.

As the carbon source gas, there may further be used, for example, gasoline, kerosine, turpentine oil, camphor oil, pine oil, heavy oil, gear oil, cylinder oil and so on. These may be employed in mixture with the hydrocarbon compounds as enumerated hereinabove.

Among those carbon source gases as described hereinabove, preferred are the paraffin-series hydrocarbons such as methane, ethane, propane and so on, which are in a gaseous nature at ambient temperature, the ketones such as acetone, benzophenone and so on, the alcohol such as methanol, ethanol and so on, and the oxygen-containing compounds such as carbon monoxide, carbon dioxide and so on. Among those enumerated immediately hereinabove, carbon monoxide is particularly preferred.

A diluting gas such as an inert gas such as hydrogen, nitrogen, helium, argon, neon, xenon or the like may also be employed together with the carbon source gas.

These gases may be admixed singly or in combination of two or more.

When hydrogen gas is admixed with the carbon source gas, the kind of the hydrogen gas is not restricted to a specified one and the hydrogen gas may be employed which is obtained by gasification of petroleum, modification of natural gas, water gas or the like, electrosis of water, reaction of iron with steam, complete gasification of coal, or the like, and purified to a sufficient extent.

The hydrogen constituting the hydrogen gas can form an atomic hydrogen when excited.

This atomic hydrogen is considered to have the catalytic action of activating the reaction for forming diamond, although its detailed mechanism is not clarified. Furthermore, it is considered to demonstrate the action of removing non-diamond ingredients such as graphite, amorphous carbon or the like, which may precipitate together with precipitation of diamond.

The carbon source gas may be employed at the rate usually ranging from 0.1% to 80% by volume in forming the diamond thin film by using the microwave plasma generating apparatus according to the present invention.

The substrate on which the diamond thin film is to be formed may be heated to allow its surface to reach usually the temperature ranging from 500° C. to 1,100° C. The pressure for the reaction may range usually from $10^{-8}$ to $10^3$ torr, preferably from $10^{-5}$ to 800 torr. If the reaction pressure would be lower than $10^{-6}$, on the one hand, the velocity at which diamond precipitates becomes too slow or no diamond can be precipitate. Even if the reaction pressure would be raised to over $10^3$ torr, on the other hand, the effect cannot be improved accordingly.

The reaction time may conveniently be set so as to form a diamond thin film in a film thickness thick enough to satisfy the use or to comply with the thickness of the substrate used.

The substrate with the diamond thin film formed thereon in the manner as described hereinabove can be applied to various uses as cutting tools, anti-abrasive members, tool members, medical tools such as surgeon's knives, dental drilling parts or the like, and as heat sinks, electronic devices and so on as well.

The present invention will specifically be described by way of examples with reference to comparative examples.

EXAMPLE 1

The microwave plasma generating apparatus of the construction shown in FIG. 7 was employed for the preparation of a diamond thin film, in which a silicon wafer of 6-inch (about 150 mm) in diameter as the plate-like substrate 14 was placed in a predetermined position in a quartz tube 13 functioning as the plasma generating chamber. A mixed gas consisting of 10% by volume of carbon monoxide CO as a reactive gas and 90% by volume of hydrogen gas was introduced into the quartz tube 13 at the flow rate of 500 cc per minute, and the microwaves were radiated from the two rectangular-sectioned waveguides 1 and 1 into the quartz tube 1 at the microwave output of 250 watts, thereby generating plasma at the periphery of the plate-like substrate 14 while the quartz tube in turn was maintained at the temperature of 40 torr. The plate-like substrate 14 was allowed to be heated at the temperature of 950° C. for 15 hours by means of the plasma generated, yielding a diamond thin film on the surface of he plate-like substrate 14 at the rate of 3 microns per hour. The error in distribution of the film thickness was found to be within 5%.

COMPARATIVE EXAMPLE 1

A diamond thin film was prepared using a conventional microwave plasma generating apparats in which the microwave is radiated from only one direction into the space where the electric discharged is performed.

The reaction conditions were substantially the same as used in Example 1 above, except for using the microwave output of 300 watts from the rectangular-sectioned waveguide 1, yielding a diamond thin film at the growth rate of 2.5 microns per hour over the entire surface area of the plate-like substrate with an error in distribution of film thicknesses being 6%.

COMPARATIVE EXAMPLE 2

Figure 12:
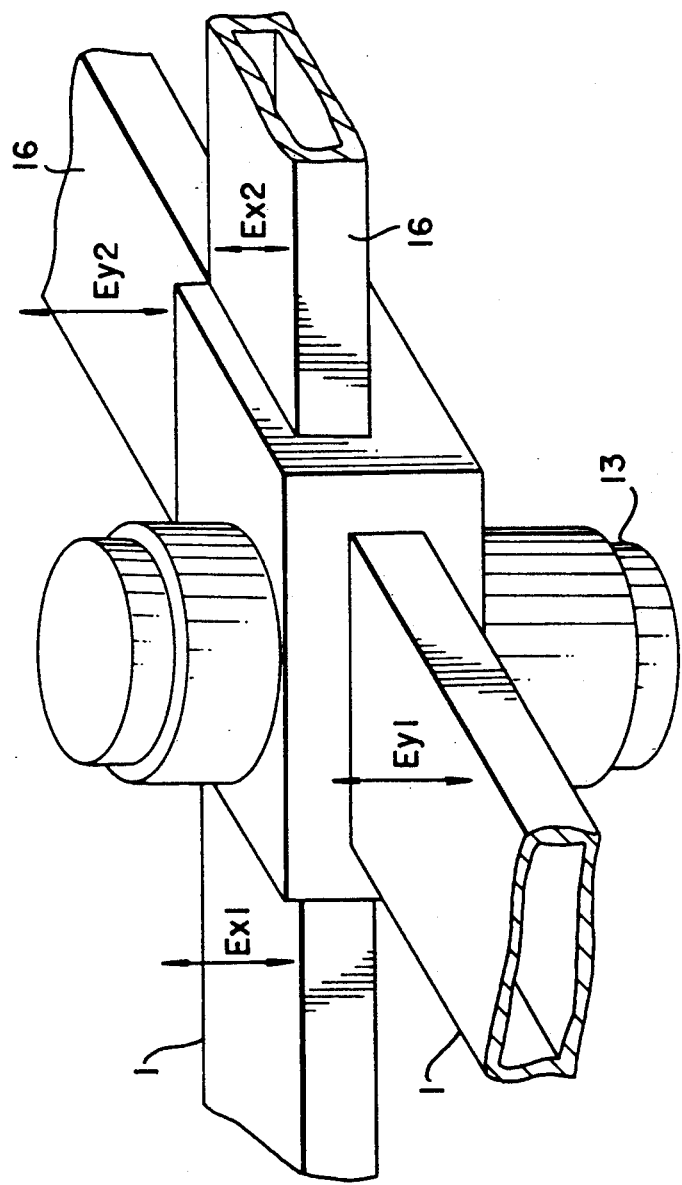
FIG. 12 is a perspective view, with a portion cut away, showing a conventional microwave plasma generating apparatus.
Figure 13:
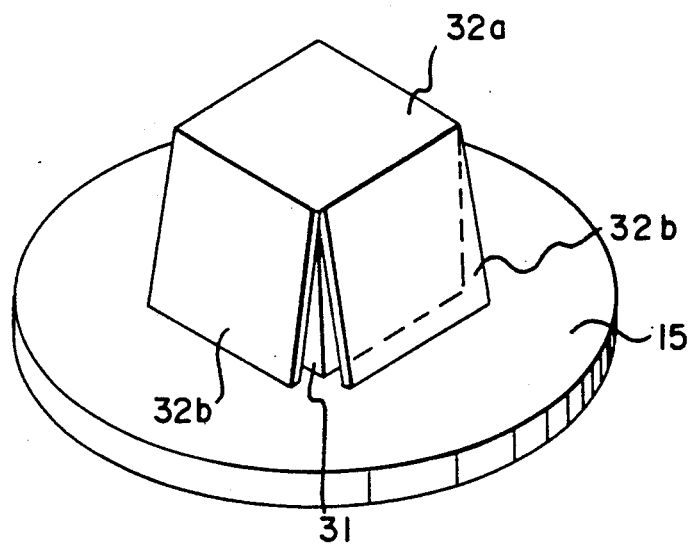
FIG. 13 is a perspective view showing the state in which a silicon wafer is disposed on a susceptor.
Figure 14:
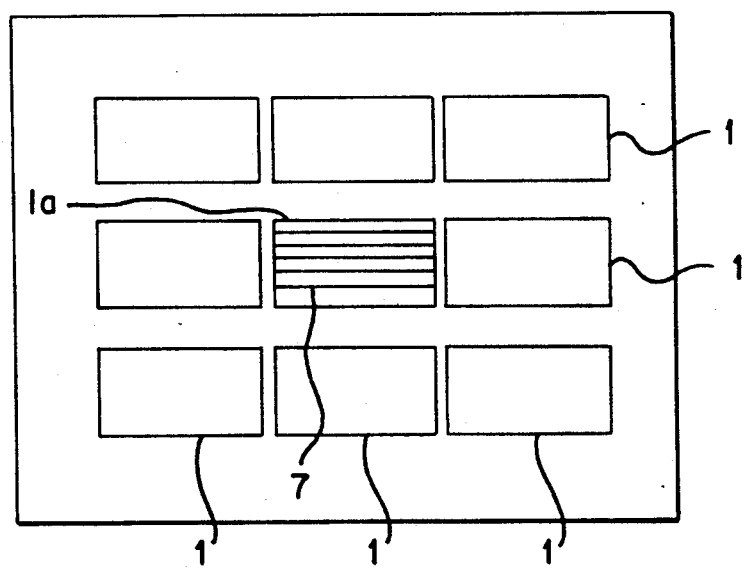
FIG. 14 is a diagrammatical representation of the disposition of the generally rectangular-sectioned waveguides, wherein only the center waveguide is provided with the plasma spaced fins.

The microwave plasma generating apparatus of the construction shown in FIG. 12 was employed for the preparation of a diamond thin film.

The reaction conditions were set to substantially the same conditions as used in Example, except for the output of 200 watts from each of the rectangular-sectioned waveguides 1 and 1 and the reaction time being set to 2 hours 35 minutes.

This experiment was suspended because the plasma has moved so as to come into contact with the quartz tube 13 which got molten at that site at the time of completion of the reaction.

Further, this experiment did not produce a diamond thin film in a center portion of the plate-like substrate and the diamond thin film formed at its outer periphery was found to be irregular in uniformity of film thickness.

EXAMPLE 2

A diamond thin film was prepared using the microwave plasma generating apparatus wherein a 100 mm×100 mm×100 mm cubic base 31 was placed on a susceptor 15 and five 100 mm×100 mm silicon wafers 32a were placed on the susceptor 15, too, so as for one wafer 32a to be placed on the top of the cubic base and for the rest of the wafers 32b to lean against and around the cubic base 31. The reaction conditions were the same as in Example 1, except for the microwave output of 300 watts and the reaction time of 10 hours.

As a result, it was found that the diamond thin film was prepared over the entire surface areas of the five silicon wafers 32a and 32b at the growth rate of 3 microns per hour with an error in distribution of film thickness of 6%.

COMPARATIVE EXAMPLE 3

The silicon wafers were placed in the same manner as in Example 2 and the reaction was carried out in the same manner as in Comparative Example 2. It was found that the plasma had migrated to such an extent to which it came into contact with the quartz tube 13 a portion of which in turn went molten in five hours from the start of the reaction, so that this experiment was suspended.

Further, this experiment did not produce a diamond thin film in a center portion of each of the silicone wafers and the diamond thin film formed at its outer periphery was found to be irregular in uniformity of film thickness.

EXAMPLE 3

The microwave plasma generating apparatus of the construction as shown in FIG. 10 was used, except for only the central rectangular-sectioned waveguide 1 with the plasma spaced fins 7 disposed for the purpose to position the plasma at a constant location.

A number of 12 mm×12 mm silicon wafers as substrates were placed on the susceptor 15 of 18 cm of diameter. A mixed gas consisting of 15% by volume of carbon monoxide and 85% by volume of hydrogen was supplied as a raw material gas at the flow rate of 150 cc per minute per a supply outlet for supplying the raw material and the pressure within the plasma generating chamber 17 was held at 40 torr. In this state, microwave was first radiated from the center-positioned and rectangular-sectioned waveguide 1 at the microwave output of 250 watts, thereby generating a seed plasma. Thereafter, the microwaves were radiated from the other rectangular-sectioned waveguides 1 to generate a large volume of plasma, and the temperature of the silicon wafers 21 were maintained at 950° C. (heated by the plasma produced) for 15 hours. As a result, it was found that the diamond thin film was produced over the entire surface areas of the silicon wafers at the growth rate of 3 microns per hour with an error in distribution of film thickness of 3%. Furthermore, it was found that the plasma generated was positioned at a constant location.

COMPARATIVE EXAMPLE 4

The microwave plasma generating apparatus of the construction as shown in FIG. 10 was used, except that only one of the rectangular-sectioned waveguides 1 was provided with the plasma spaced fins 7 and was disposed at the center position and the rest of the rectangular-sectioned waveguides 1 were disposed so as for their longer sides to be parallel to each other and so as to surround the center-positioned and rectangular-section waveguide 1.

A diamond thin film was prepared using the microwave plasma generating apparatus of the construction as described immediately hereinabove under the same reaction conditions as in Example 3. As a result, the diamond thin film was produced on the silicon wafers 21 yet the thin film was irregular in film thickness with an error in distribution of film thickness of 10%.

Further, it was found that the plasma generated during the reaction time was always so unstable that the position of the plasma was required to be adjusted so as to keep its constant location.

EXAMPLE 4

The microwave plasma generating apparatus of the construction shown in FIG. 11 was employed, in which four 12 mm×12 mm silicon wafers as plate-like substrates were placed on the susceptor 26 of 50 mm in diameter. Into the plasma generating chamber 22 of the microwave plasma generating apparatus, a mixed gas consisting of 15% by volume of carbon monoxide and 85% by volume of hydrogen was supplied at the flow rate of 200 cc per minute and the pressure within the plasma generating chamber 22 was maintained at the pressure of 40 torr. Under these conditions, the microwave was radiated from the antenna horn at the microwave output of 90 watts into the plasma generating chamber 22, thereby allowing the plasma to come into contact with the silicon wafers 27 while heating the silicon wafers 27 in the temperature of 950° C. (heated by the plasma generated). Under these reaction conditions, the silicon wafers 27 were reacted for 8 hours, yielding the diamond thin film at the growth rate of 4.3 microns per hour over the entire surface areas of the silicon wafers 27, with an error in distribution of film thickness of 3%.

EXAMPLE 5

The microwave plasma generating apparatus of the construction as shown in FIG. 10 was employed, except for all of the rectangularly-sectioned waveguides being provided with the plasma spaced fins, and the reaction was carried out in the same manner as in Example 4.

The diamond thin film was produced at the growth rate of 4 microns per hour over the entire surface areas of the silicon wafers, with an error in distribution of film thickness of 2.5%. Furthermore, it was found that the plasma was generated at a constant location during all the period for reaction.

As described hereinabove, the present invention can provide the microwave plasma generating apparatus capable of generating a large volume of plasma in a stable fashion for a long period of time during which the plasma is positioned at a constant site because the plural microwaves are radiated so as to allow their directions of the electric fields to lie perpendicular to each other in a space wherein electric discharge is performed to generate the plasma. The microwave plasma generating apparatus according to the present invention can also produce a diamond thin film of a large are as a total with high efficiency.

What is claimed is:

1. A microwave plasma generating apparatus for preparing a diamond thin film by generating plasma by radiating a plurality of microwaves into a space in which electric discharge takes place, said microwave plasma generating apparatus comprising:
   a microwave radiating means for radiating said plurality of microwaves having perpendicular directions of electric fields to each other;
   a gas discharging means for discharging gases from an electric discharge space;
   a source gas supply means for supplying a source gas to said electric discharge space; and
   a plasma generating chamber for generating plasma for defining said space in which said electric discharge occurs.

2. The microwave plasma generating apparatus as claimed in claim 1, wherein said microwave radiating means comprises a source for radiating microwaves; a microwave guide for transmitting the microwaves radiated from the source for radiating microwaves into said space in which electric discharge occurs, and an antenna horn with a fin functioning as determining a direction of the electric field of the microwaves, said antenna horn being interposed between the microwave guide and the space in which the electric discharge takes place.

3. The microwave plasma generating apparatus as claimed in claim 1, wherein said microwave radiating means are disposed in such a manner that microwaves are radiated in direction cross to the other microwaves.

4. The microwave plasma generating apparatus as claimed in claim 1, wherein said microwave radiating means are disposed in such a manner that microwaves are radiated in a direction parallel to other microwaves.

5. The microwave plasma generating apparatus as claimed in claim 1, wherein said microwave radiating means is provided with a fin for determining a direction of the electric field of said microwaves.

6. The microwave plasma generating apparatus as claimed in claim 1, wherein said microwave radiating means is provided with a fin for determining a direction of the electric field of said microwaves and a fin for positioning plasma generated at a constant location.

7. The microwave plasma generating apparatus as claimed in claim 1, wherein said microwave radiating means comprises a source for radiating microwave; and a microwave guide with a fin function for determining a direction of the electric field of the microwave as well as transmitting the microwaves radiated from the source for radiating microwave into a space in which electric discharge takes place.

8. A microwave plasma generating apparatus for preparing a diamond thin film by comprising:
   a microwave radiating means for radiating microwaves into a space wherein electric discharge takes place;
   a gas discharging means for discharging gas from the space;
   a gas supply means for supplying a raw material gas into the space;
   a plasma generating chamber forming the space; and
   plurality of microwave radiating means for radiating microwaves having perpendicular directions of electric fields into the space in which the electric discharge takes place.

9. A process for preparing a diamond thin film by radiating microwaves into a space in which electric discharge is performed and into which a carbon source gas is filled, comprising:
   a plurality of microwaves having perpendicular directions of electric fields to each other are radiated simultaneously onto the carbon source gas filled in the space in which electric discharge is performed.

* * * * *